US012489377B2

(12) United States Patent
Aeloiza et al.

(10) Patent No.: US 12,489,377 B2
(45) Date of Patent: Dec. 2, 2025

(54) SYSTEM AND METHOD FOR ZERO-VOLTAGE DETECTION IN RESONANT POLE INVERTERS

(71) Applicant: ABB Schweiz AG, Baden (CH)

(72) Inventors: Eddy Aeloiza, Richmond, VA (US); Weiqiang Chen, Richmond, VA (US); Goran Mandic, Henrico, VA (US)

(73) Assignee: ABB SCHWEIZ AG, Baden (CH)

( * ) Notice: Subject to any disclaimer, the term of this patent is extended or adjusted under 35 U.S.C. 154(b) by 255 days.

(21) Appl. No.: 18/474,807

(22) Filed: Sep. 26, 2023

(65) Prior Publication Data

US 2025/0105759 A1   Mar. 27, 2025

(51) Int. Cl.
| | |
|---|---|
| H02M 7/537 | (2006.01) |
| H02M 1/00 | (2007.01) |
| H02M 7/48 | (2007.01) |
| H03K 5/1536 | (2006.01) |
| H03K 17/13 | (2006.01) |

(52) U.S. Cl.
CPC ......... *H02M 7/537* (2013.01); *H02M 1/0058* (2021.05); *H02M 7/4815* (2021.05); *H03K 5/1536* (2013.01); *H03K 17/13* (2013.01)

(58) Field of Classification Search
CPC .. H02M 7/537; H02M 1/0058; H02M 7/4815; H02M 7/487; H02M 7/5387; H03K 5/1536; H03K 17/13; H03K 17/133
See application file for complete search history.

(56) References Cited

U.S. PATENT DOCUMENTS

| | | | | |
|---|---|---|---|---|
| 3,639,779 | A * | 2/1972 | Garrigus | H03K 5/1536 327/78 |
| 4,661,801 | A * | 4/1987 | Chen | H03K 5/1536 714/810 |
| 7,501,883 | B2 * | 3/2009 | Cho | H03F 1/0261 327/540 |
| 8,710,879 | B2 * | 4/2014 | Lin | H03K 5/00006 327/116 |
| 9,019,725 | B2 * | 4/2015 | Cantoro | H02M 3/3376 363/21.02 |
| 9,812,983 | B2 * | 11/2017 | Inoue | H02M 7/219 |
| 9,985,543 | B1 * | 5/2018 | Yi | H02M 3/33553 |
| 10,008,942 | B1 * | 6/2018 | Horwitz | H02M 3/3376 |

(Continued)

FOREIGN PATENT DOCUMENTS

| | | |
|---|---|---|
| CN | 115173711 A | 10/2022 |
| EP | 4012909 A1 | 6/2022 |

*Primary Examiner* — Yusef A Ahmed
(74) *Attorney, Agent, or Firm* — Greenberg Traurig, LLP

(57) ABSTRACT

A zero voltage detection device may include a voltage divider that scales down a first voltage to a second voltage, a comparator that compare the second voltage to one or more voltage thresholds and outputs a first set of signals indicative of an estimation of the first voltage approaching a zero-voltage instant, the one or more voltage thresholds configured to compensate for a time delay from the voltage divider, a flip flop that obtains the first set of signals and outputs a second set of signals to control a switching operation of a switching device, and a control system that obtains the second set of signals during a defined time window and that forces the switching device to turn on at an end of the defined time window if the second set of signals is not detected to limit turn-on losses.

14 Claims, 6 Drawing Sheets

(56) References Cited

U.S. PATENT DOCUMENTS

| | | | |
|---|---|---|---|
| 10,630,168 B1* | 4/2020 | Wang | H02M 1/4233 |
| 10,914,610 B2* | 2/2021 | Ariyama | G01D 5/145 |
| 2005/0212498 A1* | 9/2005 | Kubota | H02M 3/1588 |
| | | | 323/282 |
| 2006/0082349 A1* | 4/2006 | Peron | G01R 19/175 |
| | | | 323/235 |
| 2006/0226803 A1* | 10/2006 | Heikkila | H02P 27/12 |
| | | | 318/723 |
| 2012/0025797 A1* | 2/2012 | Futamura | H02M 3/156 |
| | | | 323/283 |
| 2013/0082684 A1* | 4/2013 | Spalding, Jr. | G01R 15/06 |
| | | | 324/111 |
| 2013/0241512 A1* | 9/2013 | Yamada | H02M 3/156 |
| | | | 323/283 |
| 2014/0009193 A1* | 1/2014 | Lin | H03L 7/00 |
| | | | 327/116 |
| 2014/0016363 A1* | 1/2014 | Chen | H02M 1/4225 |
| | | | 363/21.02 |
| 2014/0085949 A1* | 3/2014 | Sugawara | H02M 1/4225 |
| | | | 363/89 |
| 2014/0268894 A1* | 9/2014 | Shinohara | H02M 3/3376 |
| | | | 363/17 |
| 2014/0376281 A1* | 12/2014 | Ohashi | H02M 3/158 |
| | | | 363/25 |
| 2016/0190945 A1* | 6/2016 | Liu | H02M 3/3376 |
| | | | 363/21.02 |
| 2016/0241145 A1* | 8/2016 | Matsuura | H02M 1/14 |
| 2017/0025965 A1* | 1/2017 | Ramabhadran | H02M 3/33592 |
| 2017/0288551 A1* | 10/2017 | Hwang | H02M 1/44 |
| 2017/0331384 A1* | 11/2017 | Chen | H02M 3/33553 |
| 2018/0149712 A1* | 5/2018 | Ko | H03K 17/082 |
| 2019/0044442 A1* | 2/2019 | Schaef | H10D 1/20 |
| 2019/0089250 A1* | 3/2019 | Liu | H02M 3/33569 |
| 2019/0109496 A1* | 4/2019 | Karnstedt | H02J 50/90 |
| 2021/0028778 A1* | 1/2021 | Aeloiza | H03K 17/0822 |
| 2021/0119526 A1* | 4/2021 | Chung | H02M 3/33523 |
| 2022/0247320 A1* | 8/2022 | Stracquadaini | H02M 3/33569 |
| 2022/0416666 A1* | 12/2022 | Kawano | H02M 3/1588 |
| 2024/0039389 A1* | 2/2024 | Chen | H02M 1/0009 |
| 2024/0120845 A1* | 4/2024 | Chen | H02M 1/32 |
| 2024/0171058 A1* | 5/2024 | Chen | H02M 1/0064 |

* cited by examiner

SYSTEM AND METHOD FOR ZERO-VOLTAGE DETECTION IN RESONANT POLE INVERTERS

FIELD

The present disclosure relates to the field of inverters. More particularly, to systems and methods for zero-voltage detection in soft-switching inverters.

BACKGROUND

Conventional inverters provide AC voltage from DC power sources. For example, an uninterruptible power supply or an adjustable speed drive may include an inverter therein to supply AC voltage from a power source. To synthetize the AC voltage, inverters use a pulse width modulation (PWM) technique that consists of switching the power semiconductors devices ON and OFF at a certain switching frequency. To enable operation at high switching frequencies with high efficiency, the inverter can resort to a soft-switching technique based on switching the semiconductors devices to turn on or off when the voltage across the semiconductor is zero volts.

SUMMARY

Soft-switching devices typically utilize an auxiliary circuit to provide zero voltage switching during commutation events. Auxiliary circuits may reduce switching losses compared to conventional inverters by enabling zero-voltage switching (ZVS) during each switching cycle. To enable proper ZVS turn-on, estimation of the instant when the voltage across the main switching device reaches zero must be determined.

Conventional approaches perform zero-voltage detection ("ZVD") by calculating the approximate time the voltage will reach the zero-volt instant based on one or more parameters observed at the inverter. However, this conventional approach is sensitive to parameter deviations, temperature, and other variables which may negatively affect ZVD. Other conventional approaches may utilize an auxiliary circuit to perform the ZVD. However, accurately detecting the zero-volt instant can be challenging due to the fast switching frequencies required by the inverter and the sensitivity of the auxiliary circuit to noise. Specifically, conventional auxiliary circuits perform the ZVD by scaling down the voltage from the inverter, which amplifies the impact of noise in the auxiliary circuit and can cause false detection of the zero-volt instant. Additionally, although a common solution may be to introduce a noise filter into the auxiliary circuit, this proposed solution induces a delay which can lead to higher turn-on losses and may cause electromagnetic interference. The delay and the noise in the auxiliary circuit can result in missed zero-volt instants, which will stop the commutation process at the inverter due to not receiving the ZVD signal from the auxiliary circuit.

In some embodiments, a device for performing zero voltage detection (ZVD) includes a voltage divider, the voltage divider is configured to scale down a first voltage to a second voltage, a comparator, the comparator compares the second voltage to one or more voltage thresholds and outputs a first set of signals indicative of an estimation of the first voltage approaching a zero-voltage instant, the one or more voltage thresholds configured to compensate for a time delay from the voltage divider, a flip flop, the flip flop is configured to obtain the first set of signals and output a second set of signals to control a switching operation of a switching device, and a control system, the control system is configured to obtain the second set of signals during a defined time window, and the control system forces the switching device to turn on at an end of the defined time window if the second set of signals is not detected to limit turn-on losses.

In some embodiments, the voltage divider includes a resistive divider including one or more resistors connected in series, and a capacitive divider including one or more capacitors connected in series, each capacitor of the one or more capacitors is connected in parallel to each resistor of the one or more resistors.

In some embodiments, the resistive divider defines the second voltage during a steady-state operation, the capacitive divider defines the second voltage during a voltage transition, and a voltage ratio of the resistive divider is substantially equal to the voltage ratio of the capacitive divider.

In some embodiments, the device further includes a damping resistor, the damping resistor is configured to reduce electromagnetic noise at the device to reduce turn-on losses.

In some embodiments, the one or more voltage thresholds includes a first voltage threshold, and a second voltage threshold.

In some embodiments, the comparator includes a first comparator, the first comparator generates a first signal as output based on a comparison between the second voltage and the first voltage threshold, and a second comparator, the second comparator generates a second signal as output based on a comparison between the second voltage and the second voltage threshold, the first set of signals includes the first signal and the second signal and is representative of an estimation of the zero-volt instant.

In some embodiments, the flip flop includes a first logic gate device, and a second logic gate device, the output of the first logic gate device and the second logic gate device is connected to an input of the other of the first logic gate device and the second logic gate device.

In some embodiments, the control system obtains the second set of signals and controls the cycling of the switching device on/off.

In some embodiments, the first set of signals is immune to electrical noise in the second voltage.

In some embodiments, a system including one or more switching devices, a ZVD device associated with each switching device including a voltage divider including a resistive divider including one or more resistors connected in series, and a capacitive divider including one or more capacitors connected in series, the voltage divider scales down a first voltage to a second voltage, a comparator, the comparator compares the second voltage to one or more voltage thresholds determined based on an expected zero-voltage instant and the comparator outputs a first set of signals indicative of an estimation of the second voltage approaching a zero-voltage instant to compensate for a time delay from the voltage divider, and a flip flop, the flip flop obtains the first set of signals and outputs a second set of signals to control a switching operation of the corresponding switching device, and a control system, the control system is configured to obtain the second set of signals during a defined time window, and the control system forces the switching device to turn on at an end of the defined time window if the second set of signals is not detected to limit turn-on losses.

In some embodiments, the system further includes a damping resistor, the damping resistor is configured to reduce electromagnetic noise at the device to reduce turn-on losses.

In some embodiments, each capacitor of the one or more capacitors is connected in parallel to each resistor of the one or more resistors, the resistive divider defines the second voltage during a steady-state operation and the capacitive divider defines the second voltage during a voltage transition, and a voltage ratio of the resistive divider is substantially equal to the voltage ratio of the capacitive divider.

In some embodiments, the comparator includes a first comparator, the first comparator compares the second voltage to a first voltage threshold and generates a first ZVD signal as output representative of an estimation of the zero-voltage instant of the second voltage, and a second comparator, the second comparator compares the second voltage to a second voltage threshold and generates a second ZVD signal as output representative of the estimation of the zero-voltage instant of the second voltage, the one or more voltage thresholds includes the first voltage threshold and the second voltage threshold.

In some embodiments, the flip flop includes a first logic gate device, a second logic gate device, and the output of the first logic gate device and the second logic gate device is connected to an input of the other of the first logic gate device and the second logic gate device, the second set of signals is configured to cycle the switching device on/off based on the first set of signals.

In some embodiments, the control system obtains the second set of signals and controls the cycling of the switching device on/off.

In some embodiments, the first set of signals is immune to electrical noise in the second voltage.

In some embodiments, a method includes obtaining, by a zero voltage detection (ZVD) device, a first voltage applied to a switching device as input, scaling down, by the ZVD device, the first voltage to a second voltage within a time delay, comparing, by the ZVD device, the second voltage to one or more voltage thresholds and generating a first set of signals as output indicative of an estimation of the first voltage approaching a zero-volt instant, generating, by the ZVD device, a second set of signals as output to cycle the switching device on/off based on the first set of signals, and forcing, by the ZVD device, the switching device to turn on if the second set of signals is not detected at an end of a defined time window to limit turn-on losses, the one or more voltage thresholds are configured to compensate for the time delay.

In some embodiments, the method further includes damping, by the ZVD device, the first voltage to reduce electromagnetic noise in the first voltage and to reduce turn-on losses at the ZVD device.

In some embodiments, comparing the second voltage to the one or more voltage thresholds and generating the first set of signals as output further includes comparing, by a first comparator, the second voltage to a first voltage threshold and generating a first signal as output, comparing, by a second comparator, the second voltage to a second voltage threshold and generating a second signal as output, and the one or more voltage thresholds includes the first voltage threshold and the second voltage threshold, the second set of signals output by the ZVD device is based on the first signal and the second signal.

In some embodiments, generating the second set of signals as output to cycle the switching device on/off based on the first set of signals further includes obtaining, at a first logic gate device, the first signal as input, obtaining, at a second logic gate device, the second signal as input, and obtaining, by a control system, the second set of signals as output from the first logic gate device and controlling a cycling of the switching device on/off based on the second set of signals, the output of the first logic gate device further includes the other input to the second logic gate device, and the output of the second logic gate device includes the other input to the first logic gate device.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Various embodiments of the present disclosure relate to systems, devices, and methods for an auxiliary circuit capable of performing zero-voltage detection ("ZVD") in soft-switching circuits. The auxiliary circuit may also be known as an auxiliary resonant commutated pole ("ARCP") inverter system. The auxiliary circuit may include one or more ZVD systems or devices configured to obtain an electrical current signal directed to a switching device in the ARCP inverter system and may perform operations including performing ZVD based on the measured electrical current signal at the switching device. The ZVD system may obtain the electrical current signal and may output a gate signal to operate the switching device in a zero-voltage switching ("ZVS") mode as a result of performing the ZVD operations. In this regard, the ZVD system of the present disclosure may be capable of controlling a switching operation of the respective switching device in the ARCP inverter system while enabling high switching frequencies. The ZVD system may also include one or more electrical components therein configured to provide improved noise immunity with reduced ZVD circuit loss in transition to minimize circuit delay and provide improved tolerances to missed zero-volt instants to limit turn-on losses.

Figure 1:
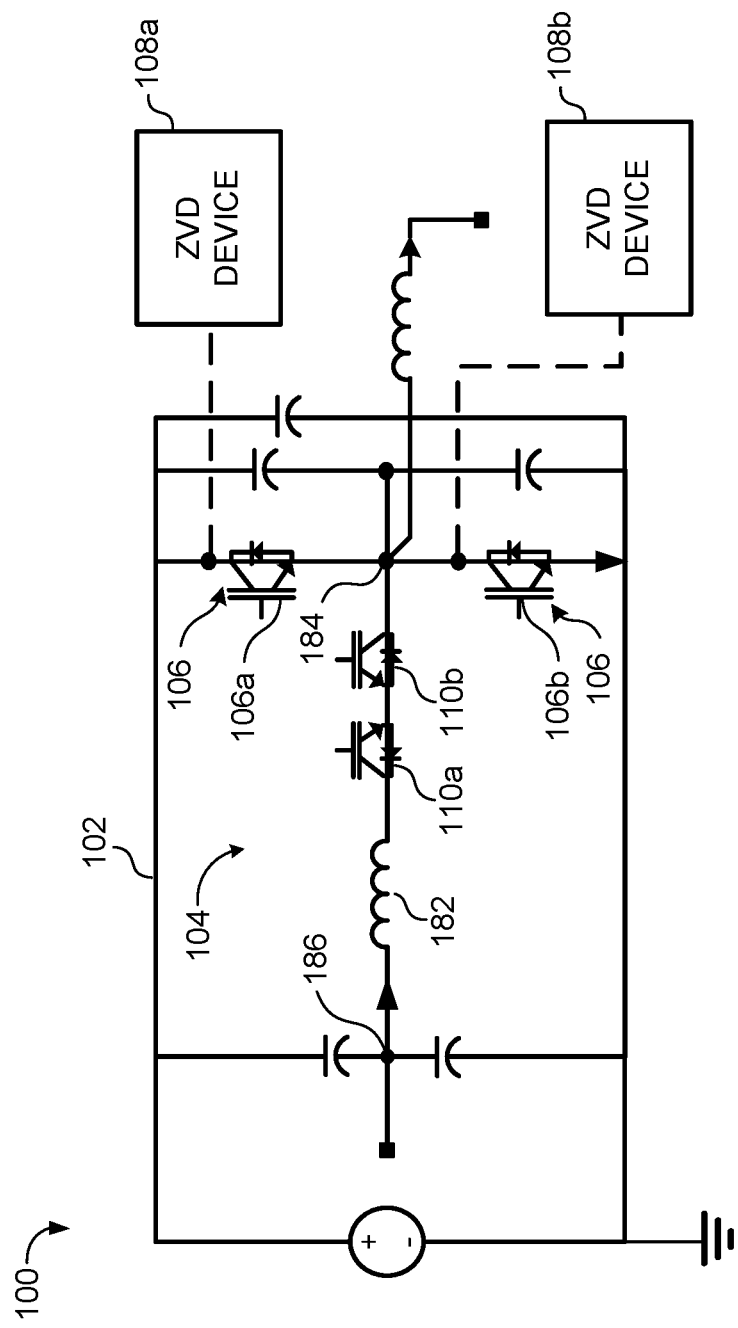
FIG. 1 illustrates a schematic diagram of a non-limiting example of a system, according to some embodiments.

FIG. 1 illustrates a schematic diagram of a non-limiting example of a system 100, according to some embodiments.

The system 100 is an ARCP inverter system including an inverter leg 102. The system 100 and inverter leg 102 may be capable of being utilized in a plurality of applications requiring high frequency switching operations. The inverter leg 102 may be a soft-switching inverter and includes switching device 106 a and switching device 106 b connected in series across inverter leg 102 (e.g., across a bus of inverter leg 102). Switching device 106 a and switching device 106 b may hereinafter be collectively referred to as switching device 106. The system 100 also includes a zero voltage detection (ZVD) device 108 associated with each respective one of the switching device 106. The inverter leg 102 may also include a resonant circuit 104 (e.g., L-C resonance circuit).

The system 100 may include ZVD device 108 a connected to inverter leg 102 at switching device 106 a, and ZVD device 108 b connected to inverter leg 102 at switching device 106 b. ZVD device 108 a and ZVD device 108 b may hereinafter be collectively referred to as ZVD devices 108. The ZVD devices 108 may be electrically connected with the inverter leg 102 adjacent a respective switching device 106 to measure the voltage (e.g., first voltage) going to the switching device 106. Additionally, each ZVD device 108 may be in electrical connection with the respective switching device 106 to control the switching operations of the switching device 106, e.g., controlling the switching device 106 turning on and off in response to gate control signals provided as output by the ZVD device 108 based on the voltage measured at the inverter leg 102.

In some embodiments, the ZVD device 108 may be electrically connected to inverter leg 102 at a cathode of the switching device 106 to measure the electrical current at the respective switching device 106 and to perform the ZVD based on the measured electrical current signal. In some embodiments, the ZVD device 108 may calculate the voltage at the cathode of the ZVD device 108 based on the measure electrical current. Based on the voltage measured at the respective switching device 106, and in response to estimating a ZVI for the voltage, the ZVD device 108 may produce a second set of signals as output. In some embodiments, the second set of signals may be gate control signals, and the gate control signals may be sent to the gate of the switching device 106 to cycle the switching device 106 on or off. In some embodiments, the ZVD device 108 may also be connected to a gate of the respective switching device 106 to cause the switching device 106 to cycle on or off based on the voltage measured at the cathode of the switching device 106.

The ZVD devices 108 enable the inverter leg 102 and switching devices 106 to perform high switching frequency operations. In this regard, each ZVD device 108 obtains the measured electrical current signal from the inverter leg 102 at the respective switching device 106 and controls the switching operation of the respective switching device 106 based on estimating when the voltage determined based on the electrical current is approaching a zero-voltage instant, as will be further described herein. The ZVD device 108 estimates the zero-voltage instant by obtaining the voltage from inverter leg 102 at the switching device 106, scaling down the voltage to a second voltage, comparing the second voltage to one or more voltage thresholds and generating a first set of signals (ZVD signals) as output indicative of an estimation of the voltage at the inverter leg 102 approaching the zero-voltage instant, and generating, based on the first set of signals, a second set of signals (gate control signals) as output by the ZVD device 108 configured to cause the switching device 106 to turn on/off to avoid missing the zero-voltage instant.

Switching device 106 may be a solid-state switching device (SSSD) capable of high switching frequency operations, according to some embodiments. In some embodiments, the switching device 106 may be a bi-directional switching device 106. The bi-directional switching device 106 may include, but is not limited to, insulated gate bipolar transistors (IGBTs), metal oxide silicon field effect transistors (MOSFETs), bipolar junction transistors (BJTs), junction-gate field effect transistors (JFETs), other semiconductor devices, or any combinations thereof, according to some embodiments. In some embodiments, the switching device 106 may be IGBTs. In other embodiments, the switching device 106 may be SiC MOSFETs. It is to be appreciated by those having ordinary skill in the art that the type of SSSD of the switching device 106 is not intended to be limiting and may include any of a plurality of SSSDs in accordance with the present disclosure.

The inverter leg 102 may include switching device 110 a and switching device 110 b, according to some embodiments. The switching device 110 a and switching device 110 b may be connected in an anti-series configuration at resonant circuit 104. In some embodiments, switching device 110 a and switching device 110 b may be located between inductor 182 and node 184 connecting the anode of the switching device 106 a to the cathode of switching device 106 b. In another embodiment, switching device 110 may be located between inductor 182 and node 186 and the inductor 182 located between the node 184 and the switching device 110.

The inverter leg 102 may include one or more other electrical circuits and/or components that enables the inverter leg 102 to perform operations in accordance with the present disclosure. It is to be appreciated by those having ordinary skill in the art that the inverter leg 102 as described in the present disclosure is not intended to be limiting and the inverter leg 102 may include other components not described herein to enable the inverter leg 102 to perform fast frequency switching operations.

Figure 2:
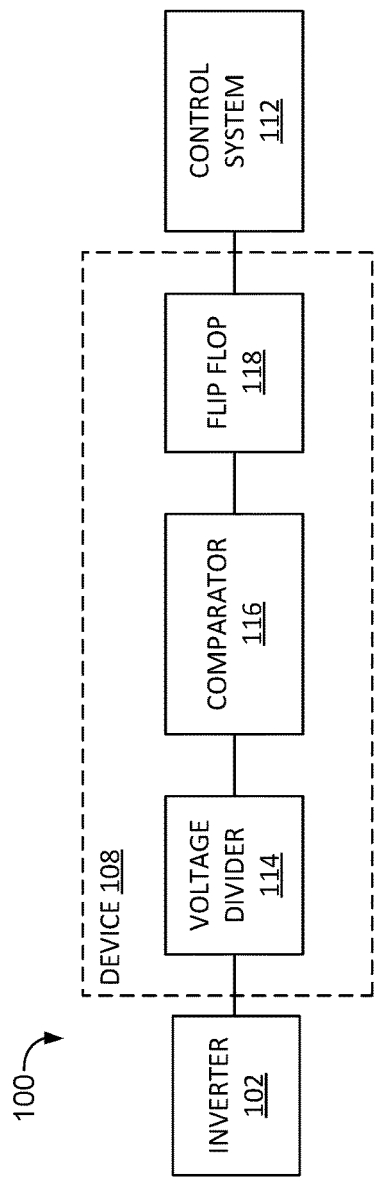
FIG. 2 is a block diagram illustrating a non-limiting example of the system of FIG. 1, according to some embodiments.

FIG. 2 is a block diagram illustrating a non-limiting example of the system 100 of FIG. 1, according to some embodiments. The ZVD device 108 is electrically connected with inverter leg 102 and control system 112. In some embodiments, the ZVD device 108 is electrically connected to the inverter leg 102 at a cathode of a switching device 106 of inverter leg 102. The ZVD device 108 includes voltage divider 114, comparator circuit 116, and flip flop circuit 118. The ZVD device 108 performs the ZVD based on obtaining an electrical voltage, V1, measured at a switching device 106 of inverter leg 102 and generating a set of signals (e.g., gate control signals) as output configured to control a switching operation of the switching device 106 based on the voltage.

In this regard, based on the voltage measured by the ZVD device 108 at switching device 106 approaches a zero-voltage instant, the ZVD device 108 may output a turn-on signal (e.g., gate signals) to cause the switching device 106 to cycle on, thereby facilitating the switching device 106 from missing the zero-voltage instant of the voltage of the inverter leg 102 at the switching device 106 and enabling the inverter leg 102 to perform the high frequency switching operations using the switching devices 106.

The ZVD device 108 includes the voltage divider 114. The voltage divider 114 obtains the voltage (e.g., a first voltage) from inverter leg 102 and scales down the voltage and outputs a second voltage. In some embodiments, the voltage may be a voltage obtained at a cathode of a respective switching device 106 of inverter leg 102. As a result of scaling down the voltage from inverter leg 102 to the second voltage, the flip flop 118 may introduce a time delay at the second voltage that lags behind the voltage from inverter leg 102.

The ZVD device 108 includes the comparator circuit 116. The comparator circuit 116 compares the second voltage from the voltage divider 114 to one or more voltage threshold values and outputs a first set of signals (e.g., ZVD signals). The one or more voltage thresholds are configured to compensate for the time delay caused by the voltage divider 114 scaling down the voltage from inverter leg 102 to the second voltage. In this regard, the comparator circuit 116 compares the second voltage to the one or more voltage thresholds instead of an expected voltage threshold to account for the time delay caused as a result of scaling down the voltage to the second voltage using the voltage divider 114. Based on the comparison, the comparator circuit 116 emits the first set of signals indicative of the voltage at the inverter leg 102 and the switching device 106 approaching the zero-voltage instant.

The comparator circuit 116 obtains the second voltage from voltage divider 114 and compares the second voltage to one or more voltage thresholds and generates the first set of signals as output. The first set of signals output by the comparator circuit 116 is an estimation by the ZVD device 108 that the voltage obtained from inverter leg 102 is approaching a zero-voltage instant, and which accounts for the time delay of the voltage divider 114 as a result of scaling down the first voltage to the second voltage. In addition, the first set of signals output by comparator circuit 116 is highly immune to noise that may be affecting the second voltage. This enables the ZVD device 108 to estimate the zero-voltage instant at inverter leg 102, and based on the estimation, the ZVD device 108 controls the cycling of the switching device 106 on/off at an optimal voltage threshold which accounts for the time delay from the voltage divider 114.

The ZVD device 108 includes the flip flop 118. The flip flop 118 obtains the first set of signals (e.g., ZVD signals) from comparator circuit 116 and generates a second set of signals (e.g., gate control signals) as output based on the comparison of the second voltage to the one or more voltage thresholds. Based on the first set of signals, which may be indicative of the voltage approaching the zero-voltage instant and which may be generated based on a comparison of the second voltage relative to the one or more voltage thresholds, the flip flop 118 outputs the second set of signals to cycle the switching device 106 in inverter leg 102 to turn on or off. In some embodiments, the flip flop circuit 118 may be a set reset (S-R) flip flop circuit.

Figure 3:
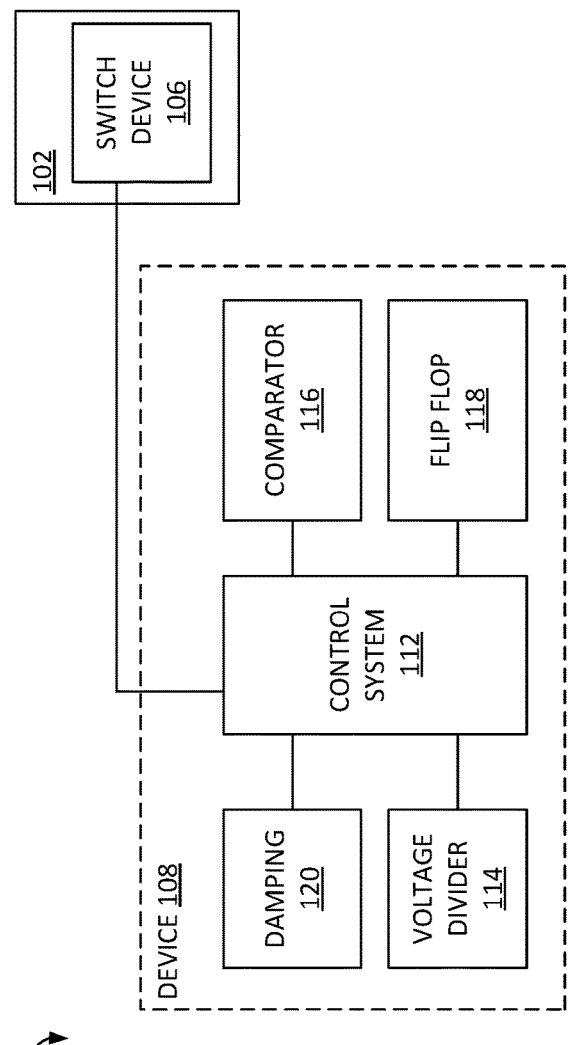
FIG. 3 is a block diagram illustrating another non-limiting example of the system, according to some embodiments.

FIG. 3 is a block diagram illustrating another non-limiting example of the system 100, according to some embodiments.

The ZVD device 108 may be in electrical connection with a switching device 106 in inverter leg 102. In some embodiments, the inverter leg 102 may include one or more of switching device 106, and system 100 may include a ZVD device 108 for each of the switching device 106 in inverter leg 102. According to some embodiments, the ZVD device 108 may include control system 112, voltage divider 114, comparator circuit 116, flip flop 118, and a damping circuit 120. It is to be appreciated by those having skill in the art that the ZVD device 108 may include one or more components including, but not limited to, the control system 112, voltage divider 114, comparator circuit 116, flip flop 118, damping circuit 120, other components and/or circuits, or any combinations thereof. It is to be appreciated by those having skill in the art that the ZVD device 108 may include one or more other components and/or circuits to enable the ZVD device 108 to perform the zero voltage detection in accordance with the present disclosure.

The ZVD device 108 may include the damping circuit 120. The damping circuit 120 may be located between an input terminal of the ZVD device 108 and voltage divider 114. The damping circuit 120 is configured to reduce noise in the ZVD device 108 that may be caused by electromagnetic interference (EMI) and/or electromagnetic noise. By reducing noise in ZVD device 108, the damping circuit 120 reduces turn-on losses by reducing the likelihood the ZVD device 108 misses or does not detect the zero-voltage instant due to fluctuations that can occur in the ZVD device 108 as a result of noise. In some embodiments, the comparator circuit 116 may include the damping circuit 120. In other embodiments, the voltage divider 114 may include the damping circuit 120.

In some embodiments, the ZVD device 108 may include the control system 112. The control system 112 may obtain the second set of signals, e.g., the gate signals, from flip flop 118 and the control system 112 may control the cycling of the switching device 106 in inverter leg 102. In some embodiments, the control system 112 may also obtain the electrical current or voltage measurement signal from the inverter leg 102.

Figure 4:
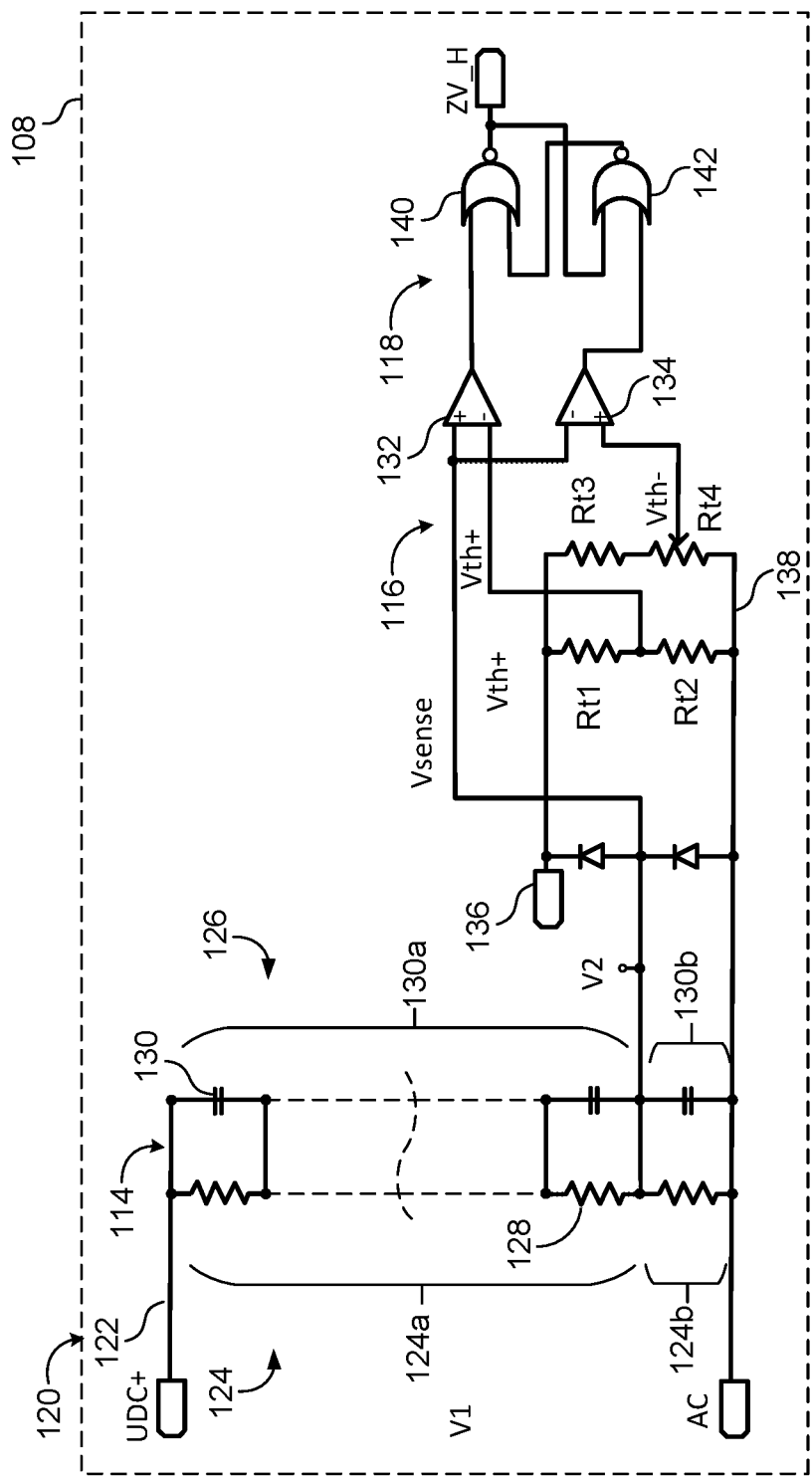
FIG. 4 is a schematic diagram illustrating a non-limiting example embodiment of a portion of the system from FIG. 1, according to some embodiments.

FIG. 4 is a schematic diagram illustrating a non-limiting example embodiment of a ZVD device 108 in FIG. 1, according to some embodiments.

The ZVD device 108 includes a damping circuit 120. The damping circuit 120 includes damping resistor 122. The damping resistor 122 reduces the noise in the ZVD device 108 that may be caused by electromagnetic interference. By reducing the noise in the ZVD device 108, the damping resistor 122 reduces turn-on losses by reducing the likelihood of the ZVD device 108 missing or not detecting the zero-voltage instant due to fluctuations in the voltage at the ZVD device 108 as a result of such noise. The damping resistor 122 may be located between an input terminal of the ZVD device 108 and the voltage divider 114. In some embodiments, the voltage divider 114 may include the damping resistor 122. In other embodiments, the comparator circuit 116 may include the damping resistor 122.

The ZVD device 108 includes the voltage divider 114. The voltage divider 114 includes a resistive divider 124 and a capacitive divider 126. The resistive divider 124 includes one or more resistors 128 connected in series. The capacitive divider 126 includes one or more capacitors 130 connected in series. In addition, the resistive divider 124 may be connected in parallel with the capacitive divider 126, according to some embodiments. In some embodiments, each resistor 128 in the resistive divider 124 may be connected in parallel with a respective capacitor 130 in capacitive divider 126. It is to be appreciated by those having ordinary skill in the art that the specific configuration of the voltage divider 114 is not intended to be limiting and the voltage divider 114 may include one or more resistors 128 and one or more capacitors 130 based on a desired operational characteristics of the ZVD device 108, in accordance with the present disclosure.

In the voltage divider 114, the voltage across the resistive divider 124 may be effectively equal to the voltage across the capacitive divider 126 such that voltage ratio between the resistive divider 124 and the capacitive divider 126 is effectively equal. This enables the voltage divider 114 to operate such that the resistive divider 124 defines the second voltage during a steady state operation, and the capacitive divider 126 defines the second voltage during a voltage transition. In some embodiments, the voltage ratio between the resistive divider 124 and the capacitive divider 126 may be equal to 1. In other embodiments, the voltage ratio between the resistive divider 124 and the capacitive divider 126 may effectively be equal to 1. In yet other embodiments, the voltage ratio between the resistive divider 124 and the capacitive divider 126 may be approximately equal to 1. However, the second voltage output by the voltage divider 114 may not exceed the comparator maximum input voltage, in some embodiments.

To improve noise immunity and reduce ZVD circuit losses, the resistive divider 124 and the capacitive divider 126 may each be configured to include high impedance values. The voltage divider 114 may be configured such that the resistive divider 124 includes a large total equivalent resistance and the capacitive divider 126 includes a low capacitance, according to some embodiments. Additionally, to minimize/reduce the effects of parasitic capacitance on the voltage divider 114, the total capacitance of capacitive divider 126 may be configured to be greater than the parasitic capacitance in the voltage divider 114 and the ZVD device 108.

The ZVD device 108 includes the comparator circuit 116. The comparator circuit 116 compares the second voltage to a first voltage threshold and a second voltage threshold and outputs a respective ZVD signal as a result of the comparison. In some embodiments, the comparator circuit 116 may compare the second voltage to a first voltage threshold and outputs a first ZVD signal based on the comparison. In addition, in some embodiments, the comparator circuit 116 may compare the second voltage to a second voltage threshold and outputs a second ZVD signal based on the comparison. In some embodiments, the first set of signals includes the first ZVD signal and the second ZVD signal. In some embodiments, the comparator circuit 116 may be a high-speed comparator. In other embodiments, the comparator circuit 116 may be an ultra-fast comparator.

The comparator circuit 116 may include comparator 132 and comparator 134, according to some embodiments. The comparator 132, e.g., first comparator, outputs the first ZVD signal based on the comparison of the second voltage to the first voltage threshold by comparator 132. For example, in some embodiments, comparator 132 outputs a value of 1 when the second voltage is greater than the first voltage threshold and comparator 132 outputs a value of 0 when the second voltage is less than the first voltage threshold. The comparator 134, e.g., second comparator, outputs the second ZVD signal based on the comparison of the second voltage to the second voltage threshold by comparator 134. For example, in some embodiments, comparator 134 outputs a value of 1 when the second voltage threshold is greater than the second voltage and comparator 134 outputs a value of 0 when the second voltage threshold is less than the second voltage.

In the ZVD device 108, the first voltage threshold and the second voltage threshold may be set at the comparator circuit 116 using a low supply voltage 136. In some embodiments, the low supply voltage 136 may be a 12 V supply voltage. In addition, the comparator circuit 116 may include a second resistive divider 138, according to some embodiments, which enables the comparator circuit 116 to generate the first voltage threshold and second voltage threshold from the low supply voltage 136. The low supply voltage 136 and the second resistive divider 138 may be configured to set the first voltage threshold and the second voltage threshold at comparator circuit 116 that may account for the time delay caused by scaling down the voltage from inverter leg 102 to the second voltage, and which is an estimation of the expected zero-voltage instant at inverter leg 102. In some embodiments, the one or more voltage thresholds may be based on the voltage at the low supply voltage 136. In other embodiments, the one or more voltage thresholds may also be based on the resistance at the second resistive divider 138.

In addition, the first voltage threshold and second voltage threshold correspond to optimal voltage thresholds configured to trigger the switching device 106 to cycle on based on the second voltage relative to the first voltage threshold and second voltage threshold to minimize the turn-on losses by the ZVD device 108. In some embodiments, the control system 112 may determine the first voltage threshold and the second voltage threshold at the ZVD device 108 and may be based on the time delay from the voltage divider 114 scaling down the voltage measured at the inverter leg 102 and the corresponding switching device 106. It is to be appreciated by those having ordinary skill in the art that the voltage of the low supply voltage 136 is not intended to be limiting and the voltage of the low supply voltage 136 may be more than or less than 12 V.

The one or more voltage thresholds at the ZVD device 108 compensates for a time delay caused as a result of scaling down the first voltage from inverter leg 102 to the second voltage. If the ZVD device 108 were to output the second set of signals, e.g., gate signals, as a result of the second voltage being at or near the expected zero-voltage instant, the actual voltage at inverter leg 102 will have passed the zero-volt instant by the time the ZVD device 108 outputs the second set of signals to trigger the switching device 106 to turn on, thereby causing turn-on losses at the respective switching device 106. For example, the ZVD device 108 sending the second set of signals based on the expected voltage threshold may cause the switching device 106 to cycle on after the zero-voltage instant. To account for the time delay introduced as a result of scaling down the voltage to the second voltage, the ZVD device 108 utilizes the one or more voltage thresholds to estimate one or more voltage thresholds, which thereby enables the ZVD device 108 to output the signals to trigger the switching device 106 to turn on/off at optimal voltages.

The flip flop circuit 118 may be in electrical connection with the comparator circuit 116. The flip flop circuit 118 obtains the first set of signals from the comparator circuit 116 and outputs the second set of signals to the control system 112 and/or to the respective ZVD device 108. The flip flop circuit 118 may include logic gate device 140 and logic gate device 142. The flip flop circuit 118 may include one or more different types of gate devices including, but not limited to, AND gates, NAND gates, OR gates, NOR gates, XOR gates, other logic gate devices, or any combinations thereof. In some embodiments, logic gate device 140 and logic gate device 142 may each be NOR gates. It is to be appreciated by those having ordinary skill in the art that the flip flop circuit 118, logic gate device 140, logic gate device 142, and/or other components of the ZVD device 108 may include one or more gate devices, each gate device being any of a plurality of different types of logic gate devices, and which may be arranged in any of a plurality of configurations to enable the ZVD device 108 to perform the ZVD operations in accordance with the present disclosure.

As shown in FIG. 4, the output of comparator 132 is connected to an input of logic gate device 140, and the output of comparator 134 is connected to an input of logic gate device 142. In addition, the output of comparator 132 and comparator 134 may be connected to an input of the other of the comparator 132 and comparator 134. Further, the output of comparator 132 outputs the second set of signals to control the cycling of the ZVD device 108 to turn on and off based on the voltage of the inverter leg 102 approaching the optimal voltage threshold, and which corresponds to the value of the second voltage relative to the first voltage threshold of comparator 132 and relative to the second voltage threshold of comparator 134.

Additionally, the output provided by logic gate device 140 based on the first set of signals controls the switching of the respective switching device 106. For example, the second voltage being greater than the first voltage threshold and the second voltage threshold causes comparator 132 to output a value of 1 to logic gate device 140 and comparator 134 to output a value of 0 to the logic gate device 142, thereby causing the flip flop 118 to output a gate control signal having a value of 1 and which causes the switching device 106 to cycle ON. In another example, the second voltage being less than the first voltage threshold and the second voltage threshold causes comparator 132 to output a value of 0 to logic gate device 140 and comparator 134 to output a value of 1 to logic gate device 142, thereby causing the comparator 132 at the flip flop circuit 118 to output a second signal or second set of signals having a value of 0 and which causes the switching device 106 to cycle OFF. It is to be appreciated by those having ordinary skill in the art that the specific configuration of the flip flop 118 is not intended to be limiting and the ZVD device 108 may include any of a plurality of other components capable of controlling a gate signal output from the ZVD device 108 as a result of comparing the second voltage from voltage divider 114 to the one or more voltage thresholds, in accordance with the present disclosure.

The system 100 and/or the ZVD device 108 may include the control system 112. The control system 112 performs one or more operations in accordance with the present disclosure, and which may include obtaining the second set of signals from the flip flop circuit 118 of the ZVD device 108, and, based on the second set of signals, controlling the switching operations of the switching device 106 as a result of the zero-volt detection by the ZVD device 108. In some embodiments, the ZVD device 108 may include the control system 112. In other embodiments, the control system 112 may be in electrical connection with the inverter leg 102 and/or the ZVD device 108 for monitoring one or more parameters of the inverter leg 102 and/or the ZVD device 108. In yet other embodiments, the inverter leg 102 may include therein the control system 112.

The control system 112 may be configured to obtain the gate control signals output by the flip flop circuit 118 and the control system 112 may control the cycling operation of the switching devices 106, according to some embodiments. In some embodiments, the control system 112 may be in electrically communicable connection with ZVD device 108 *a* and ZVD device 108 *b*, as shown in FIG. 1, and the control system 112 may send obtain the second set of signals corresponding to gate control signals from ZVD device 108 *a* and/or ZVD device 108 *b*, and the control system 112 may control the switching device 106 *a* or the switching device 106 *b*, respectively, based on the obtained signals from the corresponding ZVD device 108. In other embodiments, the system 100 may include a control system 112 *a* (not shown) in connection with the ZVD device 108 *a* and that can control the cycling of switching device 106 *a* to turn on/off based on the signals obtained from ZVD device 108 *a*, and the system 100 may include a second control system 112 *b* (not shown) in connection with ZVD device 108 *b* and that can control the cycling of switching device 106 *b* to turn on/off based on the signals obtained from ZVD device 108 *b*.

The control system 112 may be configured to control an operation of the ZVD device 108 including the timing of the ZVD device 108. In some embodiments, the control system 112 may control the ZVD device 108 such that the flip flop circuit 118 may obtain the ZVD signals from the comparator circuit 116 corresponding to a turn-on gate signal within a defined time window. In some embodiments, the control system 112 may be configured to detect the first ZVD signal and/or the second ZVD signal (e.g., value of 1) from the comparator circuit 116 within the defined time window. If the control system 112 does not detect the first ZVD signal and the second ZVD signal (e.g., value of 1) within the defined time window, the control system 112 may force the corresponding switching device 106 to cycle on or off so that the operation of the soft-switching inverter leg 102 is not interrupted as a result of missed turn-ons.

The time window may be defined to begin during the period of the voltage transition of the first voltage to the second voltage to ensure that the gate control signal to the switching device 106 is sent at a low turn-on voltage and to tolerate missed zero crossings. In some embodiments, the time window may be defined to begin when the first voltage starts to transition to the second voltage at the voltage divider 114 and to end before the first voltage reaches too high a value in its natural oscillation. In other embodiments, the time window may be defined to start at an end of a time period defining a boosting time to charge the one or more capacitors of the L-C resonant circuit 104.

The control system 112 may trigger the cycling of the switching device 106 during the defined time window. If the ZVD device 108 does not detect the zero-voltage crossing at the end of the time window, the control system 112 may, in some embodiments, force the switching device 106 to turn on so that the operation of the inverter leg 102 is not interrupted due to missing the zero-crossing and failing to turn on the switching device 106. Additionally, since the defined time window ends at a low device voltage, the turn-on losses at the inverter leg 102 may be limited.

Figure 5:
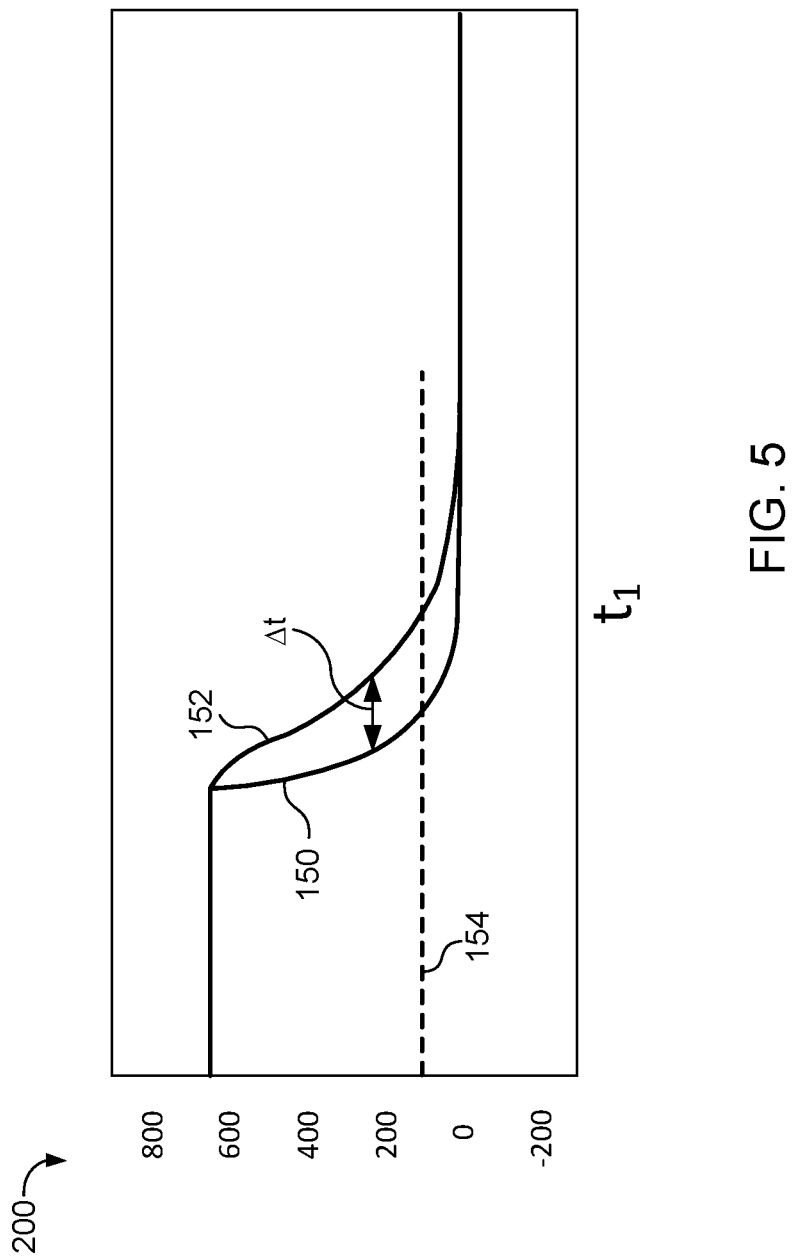
FIG. 5 illustrates a graphical representation of an operation of the system, according to some embodiments.

FIG. 5 illustrates a graphical representation 200 of an operation of the ZVD device 108, according to some embodiments.

The voltage 150 represents a first voltage measured at switching device 106 on inverter leg 102 and obtained by ZVD device 108. The voltage 152 represents a second voltage based on the voltage divider 114 scaling down the voltage 150 at the ZVD device 108. As shown in FIG. 5, there is a delay, $\Delta t$, between voltage 150 and voltage 152 corresponding to the delay induced as a result of the scaling down the first voltage to the second voltage. For example, the delay from scaling down the voltage 150 to voltage 152 may be 45 ns. The time delay is a result of the ZVD device 108 scaling down the first voltage 150 to the second voltage 152 to reduce noise in the ZVD device 108. In some embodiments, the voltage divider 114 may also scale down the first voltage 150 to the second voltage 152 such that the second voltage 152 does not exceed the comparator circuit 116 maximum voltage, thereby reducing a likelihood of the second voltage causing damage to the comparator circuit 116.

To avoid having a voltage incompatibility between the resistive divider 124 and the capacitive divider 126, the resistive divider 124 voltage ratio Nr and the capacitive divider 126 voltage ratio Nc should be equal or substantially equal (e.g., voltage ratio of 1), such that $N=Nr=Nc=R_2/(R_1+R_2)=C_1/(C_1+C_2)$ (where $R_1$ is equivalent resistance 124a, $R_2$ is equivalent resistance 124b, $C_1$ is equivalent resistance 130a, $C_2$ is equivalent resistance 130b). This combined voltage divider 114 works such that the resistive divider 124 defines the second voltage 152 in steady state, and the capacitive divider 126 defines the second voltage 152 during voltage transitions.

In FIG. 5, threshold 154 is an optimized threshold value corresponding to the second voltage threshold, $V_{th-}$, as shown in FIG. 4. By implementing optimized threshold voltages, the switching device 106 may be cycled on/off according to a timing which accounts for the time delay induced by the ZVD device 108, rather than the switching device 106 being cycled on/off when the voltage reaches an expected zero-voltage, which can lead to missed zero-voltage instances and turn-on losses.

The ZVD device 108 and comparator circuit 116 sends the first set of signals (e.g., ZVD signals) indicative of an estimation the first voltage is approaching the zero-voltage instant and which accounts for the time delay caused by the voltage divider 114. The first set of signals is configured to enable the flip flop circuit 118 to trigger the switching device 106 to cycle on/off based on a comparison of the second voltage 152 relative to the one or more voltage thresholds, e.g., the second voltage 152 relative to the first and second voltage thresholds.

The control system 112 may define the values of the one or more voltage thresholds. In some embodiments, the control system 112 may define the one or more voltage thresholds based on the expected voltage threshold. In some embodiments, the first voltage threshold may be an upper expected voltage threshold value and the second voltage threshold value may be a lower expected voltage threshold value. In other embodiments, the first voltage threshold may be a threshold during a positive phase of the input voltage and the second voltage threshold may be a threshold during a negative phase of the input voltage. In yet other embodiments, the first voltage threshold may be a threshold during a negative phase of the input voltage and the second voltage threshold may be a threshold during a positive phase of the input voltage. As the input voltage approaches the zero-voltage instant during each of the respective positive and negative phase, the ZVD device 108 may cause the flip flop circuit 118 to output the gate control signals to the switching device 106 to trigger the switching device 106 to cycle on/off based on the second voltage relative to the one or more voltage thresholds. In the example embodiment shown in FIG. 4, Rt1 and Rt2 define the first voltage threshold (for Vth+) and Rt3 and Rt4 define the second voltage threshold (for Vth−).

Figure 6:
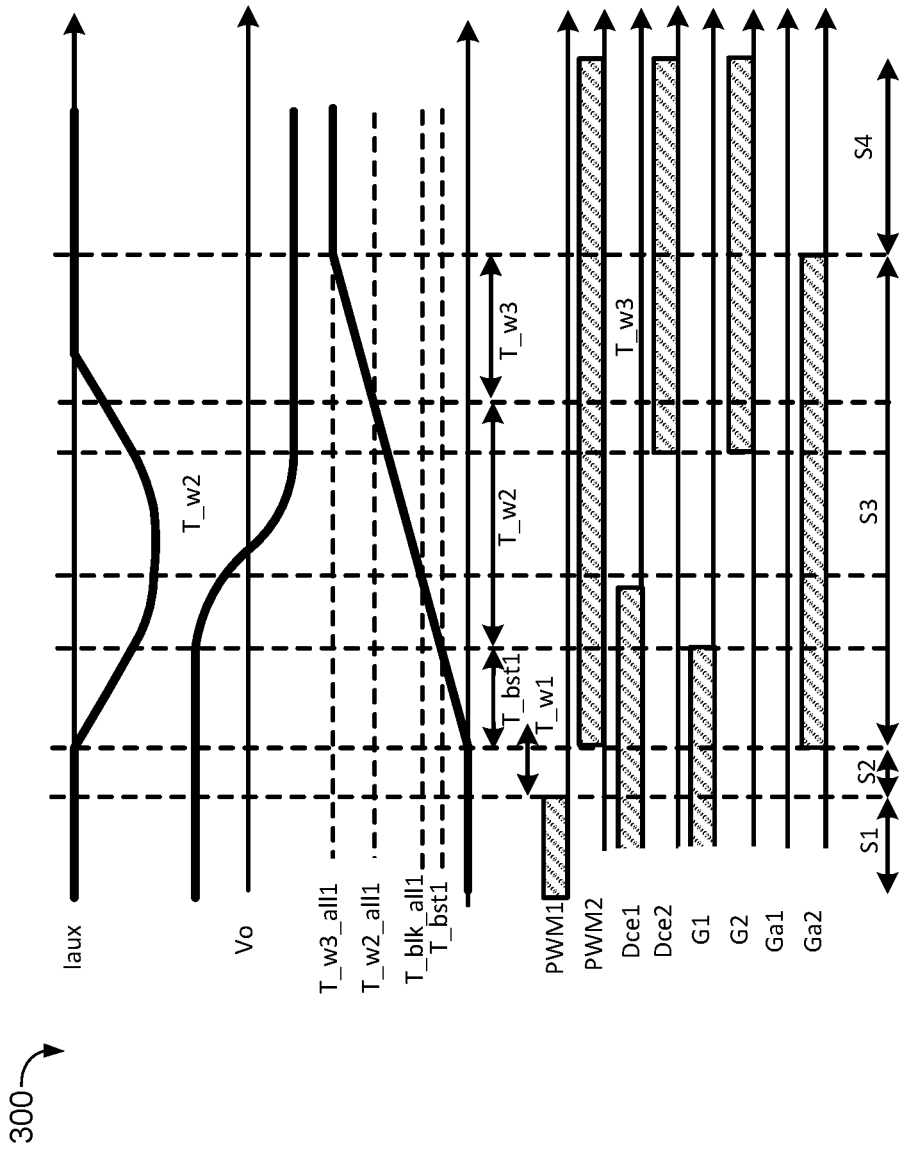
FIG. 6 illustrates a second graphical representation of a non-limiting example of the system that facilitates the zero voltage detection, according to some embodiments.

FIG. 6 illustrates a second graphical representation 300 of a non-limiting example of the system 100 that facilitates the zero voltage detection, according to some embodiments.

A transition from switching device 106 a to switching device 106 b at the inverter leg 102 is graphically illustrated, where PWM1 and PWM2 correspond to original PWM signals of inverter leg 102, Dce1 corresponds to the output signal from ZVD device 108 a and Dce2 corresponds to the output signal from ZVD device 108 b, e.g., signal ZV_H output by flip flop circuit 118 as shown in FIG. 4. G1 corresponds to gate control signals to switching device 106 a, G2 corresponds to gate control signals to switching device 106 b, Ga1 corresponds to PWM gate signals to switching device 110 a, and Ga2 corresponds to PWM gate signals to switching device 110 b. Additionally, T_w1 corresponds to the deadtime between PWM1 and PWM2, T_bst1 corresponds to the boosting time to build current in resonant inductor 182 previous to the voltage transition, Tw2 corresponds to the waiting time window for the gate signals to cycle on switching device 106 b before the control system 112 forces turn on of switching device 106 b to reduce turn-on losses, and Tw3 corresponds to the waiting time to allow switching device 110 a to turn-off.

Referring to FIG. 6, the switching device 106 b is forced on using gate control signal G2 at an end of time window T_w2. Time window T_w2 starts in transition and ends before the voltage at switching device 106 b reaches too high an oscillation. The switching device 106 b is triggered to turn on at the end of T_w2. If the ZVD device 108 misses the zero-crossing and does not turn on switching device 106 b by the end of T_w2, the ZVD device 108 and/or control system 112 forces the switching device 106 b to turn on such that the operation of the inverter leg 102 is not interrupted, according to some embodiments. Additionally, as T_w2 is defined to end at a low voltage, the turn-on losses are thereby limited. In some embodiments, the ZVD device 108 may define the time windows during the voltage transition to ensure low turn-on voltage and to enable the ZVD device 108 to limit turn-on losses. In other embodiments, the control system 112 may define the time windows during the voltage transition.

Figure 7:
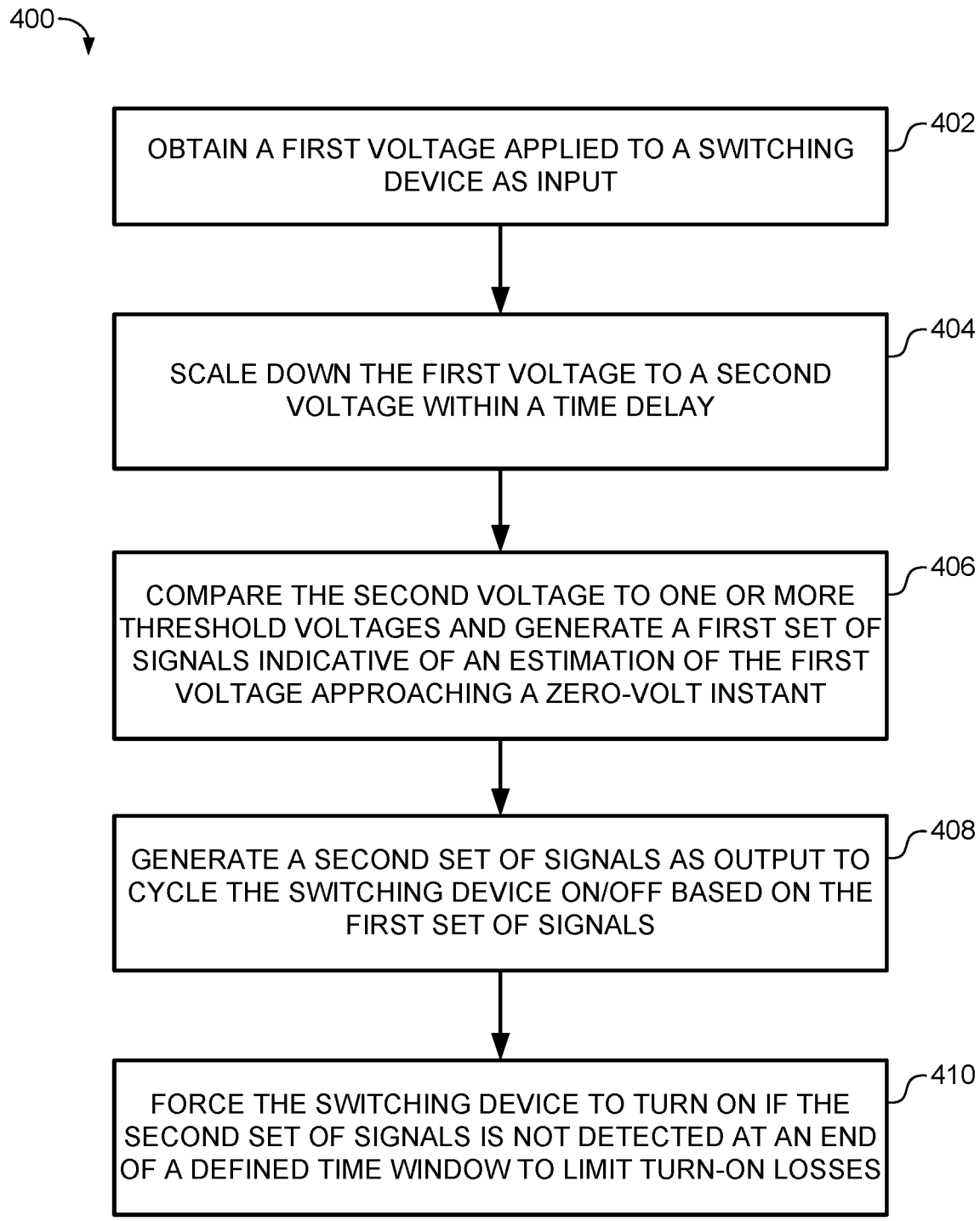
FIG. 7 illustrates a flow diagram of a method, according to some embodiments.

FIG. 7 illustrates a flow diagram of a method 400, according to some embodiments.

At 402, the method 400 includes obtaining a first voltage applied to a switching device 106 as input. In addition, the ZVD device 108 may be in electrical connection with the inverter leg 102 and/or the switching device 106. In some embodiments, the ZVD device 108 may be in electrical connection with the inverter leg 102 at a cathode of the switching device 106. In some embodiments, the ZVD device 108 may also control a cycling operation of the switching device 106 based on the measured first voltage.

In some embodiments, the method 400 includes damping the first voltage to reduce EMI and electromagnetic noise in the ZVD device 108 and to reduce turn-on losses at the ZVD device. In some embodiments, the ZVD device 108 may obtain the first voltage from the inverter leg 102 and may damp the voltage to reduce EMI and noise in the first voltage. In some embodiments, the ZVD device may include damping circuit 120, the damping circuit 120 including a damping resistor 122 to reduce the EMI and electromagnetic noise in the first voltage. In some embodiments, the damping circuit 120 may be located between the inverter leg 102 and the voltage divider 114. The damping circuit 120 damps the first voltage before passing through the voltage divider 114 in the ZVD device 108.

At 404, the method 400 includes scaling down the first voltage to a second voltage within a time delay. In some embodiments, the ZVD device 108 may include the voltage divider 114. In addition, the voltage divider 114 may include a resistive divider 124. The resistive divider 124 may include one or more resistors 128 connected in series with the other resistors 128. In other embodiments, the voltage divider 114 may also include a capacitive divider 126. The capacitive divider 126 may include one or more capacitors 130 connected in series with the other capacitors 130. In some embodiments, the voltage divider 114 may include a resistive divider 124 connected in parallel with a capacitive divider 126, where the one or more resistors 128 are connected in series, the one or more capacitors 130 are connected in series, and each resistor 128 is connected in parallel to a capacitor 130 of the one or more capacitors 130.

Scaling down the first voltage to the second voltage may further include outputting, by the voltage divider 114, a second voltage having a voltage ratio that may be substantially equal to 1 such that parasitic capacitances in the ZVD device 108 may be reduced. Moreover, the capacitive divider 126 may be configured such that the capacitance is higher than any parasitic capacitance at the ZVD device 108 and/or the voltage divider 114. In some embodiments, scaling down the first voltage to the second voltage by the voltage divider 114 further includes outputting the second voltage so as not to exceed a maximum voltage tolerance of the comparator 116.

At 406, the method 400 includes comparing the second voltage to one or more voltage thresholds and generating a first set of signals (ZVD signals) as output indicative of an estimation of the first voltage approaching a zero-voltage instant. The estimation is based on comparing the second voltage relative to the one or more voltage thresholds. In some embodiments, comparing the second voltage to one or more voltage thresholds and generating a first set of signals as output includes comparing the second voltage to a first voltage threshold and generating a first signal as output, and comparing the second voltage to a second voltage threshold and generating a second signal as output, the one or more voltage thresholds including the first voltage threshold and the second voltage threshold, and the second set of signals output by the ZVD device being determined based on the first signal and the second signal.

In some embodiments, the ZVD device includes a comparator 116 such as, for example, comparator circuit 116 as shown in FIG. 4, that compares the second voltage to the one or more voltage thresholds. In some embodiments, the comparator may include a comparator 132 that compares the second voltage to the first voltage threshold and generates the first signal as output and may include a comparator 134 that compares the second voltage to the second voltage threshold and generates the second signal as output. In some embodiments, the method 400 may include determining the first voltage threshold and the second voltage threshold based on a low-level input voltage 136, wherein the first voltage threshold and second voltage threshold are set based on the low supply voltage 136 and are configured to account for the time delay introduced by the voltage divider 114 scaling down the first voltage to the second voltage, such that the ZVD device 108 reduces turn-on losses at the switching device 106.

Based on the comparison, each of the comparator 132 and the comparator 134 outputs the first set of signals (e.g., ZVD signals) corresponding to a true, e.g., 1, or false, e.g., 0, value based on the respective comparisons. For example, the comparator 132 outputs a value of 1 and comparator 134 outputs a value of 0 indicating the second voltage is greater than the first voltage threshold and second voltage threshold. In another example, as the first voltage approaches zero, the second voltage may fall below the first voltage threshold and the second voltage threshold, and comparator 132 outputs a value of 0 and comparator 134 outputs a value of 1, the first set of signals output of the comparator circuit 116 thereby indicating the first voltage is approaching the zero-voltage instant based on the second voltage.

The values of the one or more voltage thresholds may correspond to optimized voltage thresholds determined based on an expected voltage threshold value for when the first voltage is expected to reach the zero-voltage instant while simultaneously compensating for the time delay induced from scaling down the voltage. In some embodiments, comparing the second voltage to the one or more voltage thresholds further includes determining the one or more voltage threshold values to compensate for the time delay caused as a result of the voltage divider 114 scaling down the first voltage to the second voltage. In some embodiments, the optimized voltage thresholds may be a pre-defined value. In other embodiments, the control system 112 may define the one or more voltage thresholds based on the expected voltage threshold. In other embodiments, the ZVD device 108 may be configured with the one or more voltage thresholds as input such that the ZVD device 108 triggers the switching device 106 to cycle on/off when the second voltage reaches the one or more voltage thresholds rather than the expected zero-volt instant.

At 408, the method 400 includes generating a second set of signals as output to cycle the switching device 106 on/off based on the first set of signals. In some embodiments, the second set of signals may be gate control signals to cause the switching device 106 to cycle on/off based on the first set of signals and based on the first voltage approaching the zero-volt instant. For example, in some embodiments, the second set of signals may be a turn-on signal to cycle on the switching device 106 based on the first voltage approaching the zero-voltage instant.

In some embodiments, the ZVD device 108 may include a flip flop circuit 118 such as, for example, flip flop circuit 118 as shown in FIG. 4. The flip flop circuit 118 may include logic gate device 140 and logic gate device 142. Moreover, the flip flop circuit 118 may be connected to the output of the comparator circuit 116 to obtain the first set of signals as input. In some embodiments, the output of comparator 132 may be connected to the logic gate device 140 as input, and the output of the comparator 134 may be connected to the logic gate device 142 as input. Moreover, the output of the logic gate device 140 corresponds to the output of the ZVD device 108 and the output of the logic gate device 140 may also be connected to the input of the logic gate device 142, while the output of the logic gate device 142 is connected to the input of the logic gate device 140.

The flip flop circuit 118 obtains the first set of signals from the comparator circuit 116 and provides the second set of signal as output based on the inputs, according to some embodiments. In some embodiments, the logic gate device 140 obtains a first ZVD signal from the comparator 132 and the logic gate device 142 obtains a second ZVD signal from the comparator 134 and the method 400 includes the logic gate device 140 outputting the second set of signals (e.g., gate signals) to cycle the switching device 106 on/off. In some embodiments, the flip flop 118 may be a S-R flip flop circuit which turns the switching device 106 on/off based on the ZVD signals obtained as input from the comparator 116, in some embodiments.

In some embodiments, generating the second set of signals as output to cycle the switching device 106 on/off based on the first set of signals further includes obtaining, by logic gate device 140, the first signal as input and obtaining, by logic gate device 142, the second signal as input, and generating the second set of signals as output based on the first signal and second signal. Additionally, in some embodiments, generating the second set of signals further includes obtaining the second set of signals as output from logic gate device 140 and controlling a cycling of the switching device 106 on/off based on the second set of signals.

In some embodiments, generating the second set of signals includes the logic gate device 140 providing as output a first gate control signal to cycle switching device 106 from a first state to a second state in response to the second voltage being greater than the first voltage threshold and second voltage threshold, and providing a second gate signal as output to cycle the switching device 106 from the second state to the first state in response to the second voltage being less than the first voltage threshold and second voltage threshold. In some embodiments, the second voltage being less than the first voltage threshold and the second voltage threshold may cause the ZVD device 108 to output a second set of signals that causes the switching device 106 to cycle on, and the second voltage being greater than the first voltage threshold and the second voltage threshold may cause the ZVD device 108 to output a second set of signals that causes the switching device 106 to cycle off. In other embodiments, the second voltage being greater than the first voltage threshold and the second voltage threshold may cause the ZVD device 108 to output a second set of signals that causes the switching device to cycle on, and the second voltage being less than the first voltage threshold and the second voltage threshold may cause the ZVD device 108 to output a second set of signals that causes the switching device 106 to cycle off.

At 410, the method 400 includes forcing the switching device 106 to turn on if the second set of signals is not detected at an end of a defined time window to limit turn-on losses. In some embodiments, the method 400 may include defining the time window for when the second set of signals to cycle on the switching device 106 is configured to be detected from the ZVD device 108. In this regard, in some embodiments, the method 400 may include cycling, by control system 112, the switching device 106 to cycle on if the second set of signals configured to turn-on the switching device 106 is not detected by the end of the defined time window to limit turn-on losses and to enable the inverter leg 102 to continue operating without interruption.

All prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "between" does not necessarily require being disposed directly next to other elements. Generally, this term means a configuration where something is sandwiched by two or more other things. At the same time, the term "between" can describe something that is directly next to two opposing things. Accordingly, in any one or more of the embodiments disclosed herein, a particular structural component being disposed between two other structural elements can be:

- disposed directly between both of the two other structural elements such that the particular structural component is in direct contact with both of the two other structural elements;
- disposed directly next to only one of the two other structural elements such that the particular structural component is in direct contact with only one of the two other structural elements;
- disposed indirectly next to only one of the two other structural elements such that the particular structural component is not in direct contact with only one of the two other structural elements, and there is another element which juxtaposes the particular structural component and the one of the two other structural elements;
- disposed indirectly between both of the two other structural elements such that the particular structural component is not in direct contact with both of the two other structural elements, and other features can be disposed therebetween; or
- any combination(s) thereof.

As used herein "embedded" means that a first material is distributed throughout a second material.

Various Aspects are described below. It is to be understood that any one or more of the features recited in the following Aspect(s) can be combined with any one or more other Aspect(s).

ASPECTS

Aspect 1. A device for performing zero voltage detection (ZVD) comprising: a voltage divider, wherein the voltage divider is configured to scale down a first voltage to a second voltage; a comparator, wherein the comparator compares the second voltage to one or more voltage thresholds and outputs a first set of signals indicative of an estimation of the first voltage approaching a zero-voltage instant, the one or more voltage thresholds configured to compensate for a time delay from the voltage divider; a flip flop, wherein the flip flop is configured to obtain the first set of signals and output a second set of signals to control a switching operation of a switching device; and a control system, wherein the control system is configured to obtain the second set of signals during a defined time window, and the control system forces the switching device to turn on at an end of the defined time window if the second set of signals is not detected to limit turn-on losses.

Aspect 2. The device according to aspect 1, wherein the voltage divider comprises: a resistive divider comprising: one or more resistors connected in series, and a capacitive divider comprising: one or more capacitors connected in series, wherein each capacitor of the one or more capacitors is connected in parallel to each resistor of the one or more resistors.

Aspect 3. The device according to aspect 2, wherein the resistive divider defines the second voltage during a steady-state operation, and wherein the capacitive divider defines the second voltage during a voltage transition, wherein a voltage ratio of the resistive divider is substantially equal to the voltage ratio of the capacitive divider.

Aspect 4. The device according to any of the preceding aspects, further comprising: a damping resistor, wherein the damping resistor is configured to reduce electromagnetic noise at the device to reduce turn-on losses.

Aspect 5. The device according to any of the preceding aspects, wherein the one or more voltage thresholds comprises: a first voltage threshold, and a second voltage threshold.

Aspect 6. The device according to aspect 5, wherein the comparator comprises: a first comparator, wherein the first comparator generates a first signal as output based on a comparison between the second voltage and the first voltage threshold, and a second comparator, wherein the second comparator generates a second signal as output based on a comparison between the second voltage and the second voltage threshold, wherein the first set of signals comprises the first signal and the second signal and is representative of an estimation of the zero-volt instant.

Aspect 7. The device according to any of the preceding aspects, wherein the flip flop comprises: a first logic gate device, and a second logic gate device, wherein the output of the first logic gate device and the second logic gate device is connected to an input of the other of the first logic gate device and the second logic gate device.

Aspect 8. The device according to any of the preceding aspects, wherein the control system obtains the second set of signals and controls the cycling of the switching device on/off.

Aspect 9. The device according to any of the preceding aspects, wherein the first set of signals is immune to electrical noise in the second voltage.

Aspect 10. A system comprising: one or more switching devices; a ZVD device associated with each switching device comprising: a voltage divider comprising: a resistive divider comprising: one or more resistors connected in series, and a capacitive divider comprising: one or more capacitors connected in series, wherein the voltage divider scales down a first voltage to a second voltage, a comparator, wherein the comparator compares the second voltage to one or more voltage thresholds determined based on an expected zero-voltage instant and the comparator outputs a first set of signals indicative of an estimation of the second voltage approaching a zero-voltage instant to compensate for a time delay from the voltage divider; and a flip flop, wherein the flip flop obtains the first set of signals and outputs a second set of signals to control a switching operation of the corresponding switching device; and a control system, wherein the control system is configured to obtain the second set of signals during a defined time window, and the control system forces the switching device to turn on at an end of the defined time window if the second set of signal is not detected to limit turn-on losses.

Aspect 11. The system according to aspect 10, further comprising: a damping resistor, wherein the damping resistor is configured to reduce electromagnetic noise at the device to reduce turn-on losses.

Aspect 12. The system according to aspects 10 or 11, wherein each capacitor of the one or more capacitors is connected in parallel to each resistor of the one or more resistors, wherein the resistive divider defines the second voltage during a steady-state operation and the capacitive divider defines the second voltage during a voltage transition, and a voltage ratio of the resistive divider is substantially equal to the voltage ratio of the capacitive divider.

Aspect 13. The system according to aspects 10, 11, or 12, wherein the comparator comprises: a first comparator, wherein the first comparator compares the second voltage to a first voltage threshold and generates a first ZVD signal as output representative of an estimation of the zero-voltage instant of the second voltage, and a second comparator, wherein the second comparator compares the second voltage to a second voltage threshold and generates a second ZVD signal as output representative of the estimation of the zero-voltage instant of the second voltage, wherein the one or more voltage thresholds comprises the first voltage threshold and the second voltage threshold.

Aspect 14. The system according to aspects 10, 11, 12, or 13, wherein the flip flop comprises: a first logic gate device, a second logic gate device, and wherein the output of the first logic gate device and the second logic gate device is connected to an input of the other of the first logic gate device and the second logic gate device as inputs, wherein the second set of signals is configured to cycle the switching device on/off based on the first set of signals.

Aspect 15. The system according to aspects 10, 11, 12, 13, or 14, wherein the control system obtains the second set of signals and controls the cycling of the switching device on/off.

Aspect 16. The system according to aspects 10, 11, 12, 13, 14, or 15, wherein the first set of signals is immune to electrical noise in the second voltage.

Aspect 17. A method comprising: obtaining, by a zero voltage detection (ZVD) device, a first voltage applied to a switching device as input; scaling down, by the ZVD device, the first voltage to a second voltage within a time delay; comparing, by the ZVD device, the second voltage to one or more voltage thresholds and generating a first set of signals as output indicative of an estimation of the first voltage approaching a zero-volt instant; generating, by the ZVD device, a second set of signals as output to cycle the switching device on/off based on the first set of signals; and forcing, by the ZVD device, the switching device to turn on if the second set of signals is not detected at an end of a defined time window to limit turn-on losses; wherein the one or more voltage thresholds are configured to compensate for the time delay.

Aspect 18. The method according to aspect 17, further comprising: damping, by the ZVD device, the first voltage to reduce electromagnetic noise in the first voltage and to reduce turn-on losses at the ZVD device.

Aspect 19. The method according to aspects 17 or 18, wherein comparing the second voltage to the one or more voltage thresholds and generating the first set of signals as output further comprises: comparing, by a first comparator, the second voltage to a first voltage threshold and generating a first signal as output, comparing, by a second comparator, the second voltage to a second voltage threshold and generating a second signal as output, and wherein the one or more voltage thresholds comprises the first voltage threshold and the second voltage threshold, wherein the second set of signals output by the ZVD device is based on the first signal and the second signal.

Aspect 20. The method according to aspect 19, wherein generating the second set of signals as output to cycle the switching device on/off based on the first set of signals further comprises: obtaining, at a first logic gate device, the first signal as input, obtaining, at a second logic gate device, the second signal as input, and obtaining, by a control system, the second set of signals as output from the first logic gate device and controlling a cycling of the switching device on/off based on the second set of signals, wherein the output of the first logic gate device further comprises the other input to the second logic gate device, and the output of the second logic gate device comprises the other input to the first logic gate device.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A device for performing zero voltage detection (ZVD) comprising:
   a voltage divider,
      wherein the voltage divider is configured to scale down a first voltage to a second voltage;
   a comparator comprising:
      a first comparator, and
      a second comparator,
      wherein the comparator compares the second voltage to one or more voltage thresholds and outputs a first set of signals indicative of an estimation of the first voltage approaching a zero-voltage instant, the one or more voltage thresholds configured to compensate for a time delay from the voltage divider,
      wherein the one or more voltage thresholds comprises a first voltage threshold and a second voltage threshold,
      wherein the first comparator generates a first signal as output based on a comparison between the second voltage and the first voltage threshold,
      wherein the second comparator generates a second signal as output based on a comparison between the second voltage and the second voltage threshold, and
      wherein the first set of signals comprises the first signal and the second signal and is representative of an estimation of the zero-voltage instant;
   a flip flop comprising:
      a first logic gate device, and
      a second logic gate device,
      wherein each of an output of the first logic gate device and an output of the second logic gate device is connected to an input of the other of the first logic gate device and the second logic gate device, respectively, and
      wherein the flip flop is configured to obtain the first set of signals and output a second set of signals to control a switching operation of a switching device; and
   a control system,
      wherein the control system is configured to obtain the second set of signals during a defined time window, and the control system forces the switching device to turn on at an end of the defined time window if the second set of signals is not detected to limit turn-on losses.

2. The device according to claim 1, wherein the voltage divider comprises:
   a resistive divider comprising:
      two or more resistors connected in series, and
   a capacitive divider comprising:
      two or more capacitors connected in series,
   wherein each capacitor of the two or more capacitors is connected in parallel to a respective resistor of the two or more resistors.

3. The device according to claim 2, wherein the resistive divider defines the second voltage during a steady-state operation,
   wherein the capacitive divider defines the second voltage during a voltage transition, and
   wherein a voltage ratio of the resistive divider is substantially equal to a voltage ratio of the capacitive divider.

4. The device according to claim 1, further comprising:
   a damping resistor,
      wherein the damping resistor is configured to reduce electromagnetic noise at the device to reduce turn-on losses.

5. The device according to claim 1, wherein the control system obtains the second set of signals and controls cycling of the switching device to be turned on/off.

6. The device according to claim 1, wherein the first set of signals is immune to electrical noise in the second voltage.

7. A system comprising:
   two or more switching devices;
   two or more ZVD devices, each ZVD device associated with a respective switching device of the two or more switching devices and comprising:
      a voltage divider comprising:
         a resistive divider comprising:
            two or more resistors connected in series, and
         a capacitive divider comprising:
            two or more capacitors connected in series,
         wherein the voltage divider scales down a first voltage to a second voltage,
      a comparator comprising:
         a first comparator, and
         a second comparator,
         wherein the comparator compares the second voltage to one or more voltage thresholds determined based on an expected zero-voltage instant and the comparator outputs a first set of signals indicative of an estimation of the second voltage approaching a zero-voltage instant to compensate for a time delay from the voltage divider,
      a flip flop comprising:
         a first logic gate device, and
         a second logic gate device,
         wherein the flip flop obtains the first set of signals and outputs a second set of signals to control a switching operation of the respective switching device,
         wherein the one or more voltage thresholds comprises a first voltage threshold and a second voltage threshold,
         wherein the first comparator compares the second voltage to the first voltage threshold of the one or more voltage thresholds and generates a first ZVD signal as output representative of an estimation of the zero-voltage instant of the second voltage,
         wherein the second comparator compares the second voltage to the second voltage threshold of the one or more voltage thresholds and generates a second ZVD signal as output representative of the estimation of the zero-voltage instant of the second voltage,
         wherein the first set of signals comprises the first ZVD signal and the second ZVD signal and is representative of an estimation of the zero-voltage instant, and
         wherein each of an output of the first logic gate device and an output of the second logic gate device is connected to an input of the other of the first logic gate device and the second logic gate device, respectively; and
      a control system, wherein the control system is configured to obtain the second set of signals during a defined time window, and the control system forces the respective switching device to turn on at an end of the defined time window if the second set of signals is not detected to limit turn-on losses.

8. The system according to claim 7, further comprising:
a damping resistor,
wherein the damping resistor is configured to reduce electromagnetic noise at the two or more ZVD devices to reduce turn-on losses.

9. The system according to claim 7, wherein each capacitor of the two or more capacitors is connected in parallel to a respective resistor of the two or more resistors, and wherein the resistive divider defines the second voltage during a steady-state operation and the capacitive divider defines the second voltage during a voltage transition.

10. The system according to claim 7,
wherein the second set of signals is configured to cycle the respective switching device to be turned on/off based on the first set of signals.

11. The system according to claim 7, wherein the control system obtains the second set of signals and controls cycling of the respective switching device to be turned on/off.

12. The system according to claim 7, wherein the first set of signals is immune to electrical noise in the second voltage.

13. A method comprising:
obtaining, by a zero voltage detection (ZVD) device, a first voltage applied to a switching device as input;
scaling down, by the ZVD device, the first voltage to a second voltage within a time delay;
comparing, by the ZVD device, the second voltage to one or more voltage thresholds and generating a first set of signals as output indicative of an estimation of the first voltage approaching a zero-volt instant;
generating, by the ZVD device, a second set of signals as output to cycle the switching device to be turned on/off based on the first set of signals; and
forcing, by the ZVD device, the switching device to turn on if the second set of signals is not detected at an end of a defined time window to limit turn-on losses;
wherein the one or more voltage thresholds are configured to compensate for the time delay,
wherein the one or more voltage thresholds comprising a first voltage threshold and a second voltage threshold,
wherein comparing the second voltage to the one or more voltage thresholds and generating the first set of signals as output further comprising:
comparing, by a first comparator, the second voltage to the first voltage threshold of the one or more voltage thresholds and generating a first signal as output, and
comparing, by a second comparator, the second voltage to the second voltage threshold of the one or more voltage thresholds and generating a second signal as output,
wherein the second set of signals output by the ZVD device is based on the first signal and the second signal,
wherein generating the second set of signals as output to cycle the switching device to be turned on/off based on the first set of signals further comprises:
obtaining, at a first logic gate device, the first signal as input,
obtaining, at a second logic gate device, the second signal as input, and
obtaining, by a control system, the second set of signals as output from the first logic gate device and the second logic gate device and controlling a cycling of the switching device to be turned on/off based on the second set of signals, and
wherein an output of the first logic gate device is connected to a second input of the second logic gate device, and an output of the second logic gate device is connected to a second input of the first logic gate device.

14. The method according to claim 13, further comprising:
damping, by the ZVD device, the first voltage to reduce electromagnetic noise in the first voltage and to reduce turn-on losses at the ZVD device.

* * * * *